United States Patent [19]

Sauzade et al.

[11] Patent Number: 4,878,152
[45] Date of Patent: Oct. 31, 1989

[54] MOUNTING FOR PRINTED CIRCUITS FORMING A HEAT SINK WITH CONTROLLED EXPANSION

[75] Inventors: Jean-Denis Sauzade, Juan Les Pins; Manuel L'Hote, Vence, both of France

[73] Assignee: Thomson-CSF, Paris, France

[21] Appl. No.: 205,960

[22] Filed: Jun. 13, 1988

[30] Foreign Application Priority Data

Jun. 16, 1987 [FR] France .................. 87 08372

[51] Int. Cl.⁴ .................. H05K 7/20; B32B 3/00
[52] U.S. Cl. .................. 361/386; 156/634; 165/185; 174/68.5; 428/209; 428/212; 428/408
[58] Field of Search .................. 174/68.5, 16 HS; 165/80.3, 185; 357/81; 361/386–389, 397, 412; 428/212, 209, 408; 156/634, 253, 901

[56] References Cited

U.S. PATENT DOCUMENTS 3,952,231  4/1976  Davidson et al. .................. 361/386
4,318,954  3/1982  Jensen .................. 174/68.5
4,495,378  1/1985  Dötzer et al. .................. 174/68.5
4,689,110  8/1987  Leibowitz .................. 361/388

FOREIGN PATENT DOCUMENTS 0197817  10/1986  European Pat. Off.
2207401  6/1974  France .
1114066  5/1968  United Kingdom .

Primary Examiner—Gregory D. Thompson
Attorney, Agent, or Firm—Oblon, Spivak, McClelland, Maier & Neustadt

[57] ABSTRACT

A mounting that forms a heat sink for printed circuit boards comprising a graphite core oriented by compression to obtain very high lateral thermal conductivity and relatively low density is disclosed. This core is held by two outer skins made up of folds of carbon fibers embedded in an epoxy resin matrix. A metallic frame made of invar makes the mounting rigid, thus giving mountings that conduct heat very well while at the same time being light.

6 Claims, 2 Drawing Sheets

FIG_1 PRIOR ART
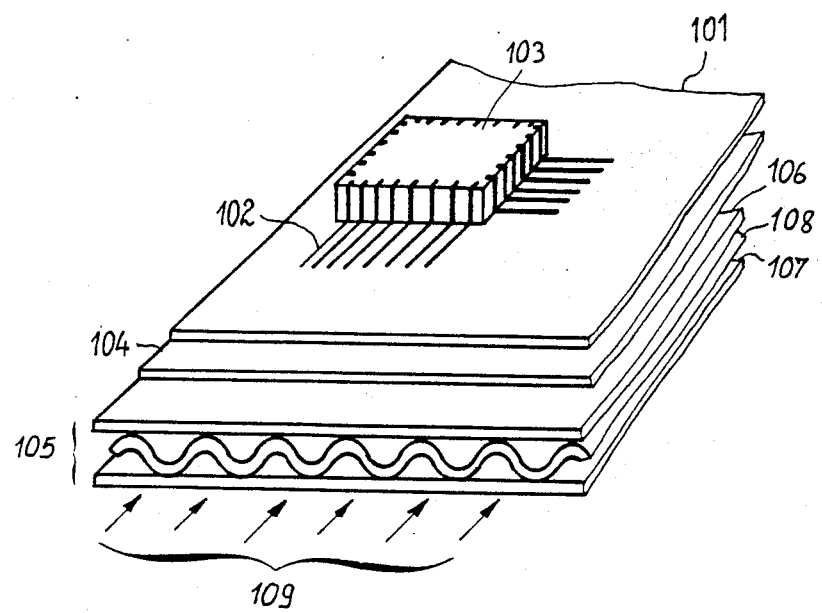
FIG_2
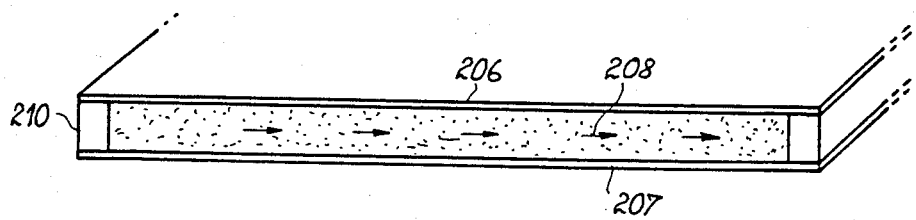

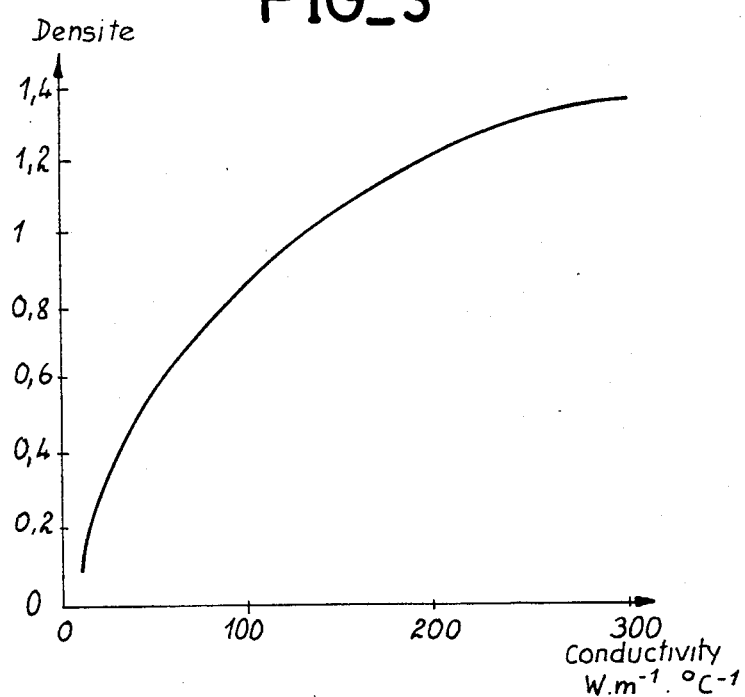
FIG_3
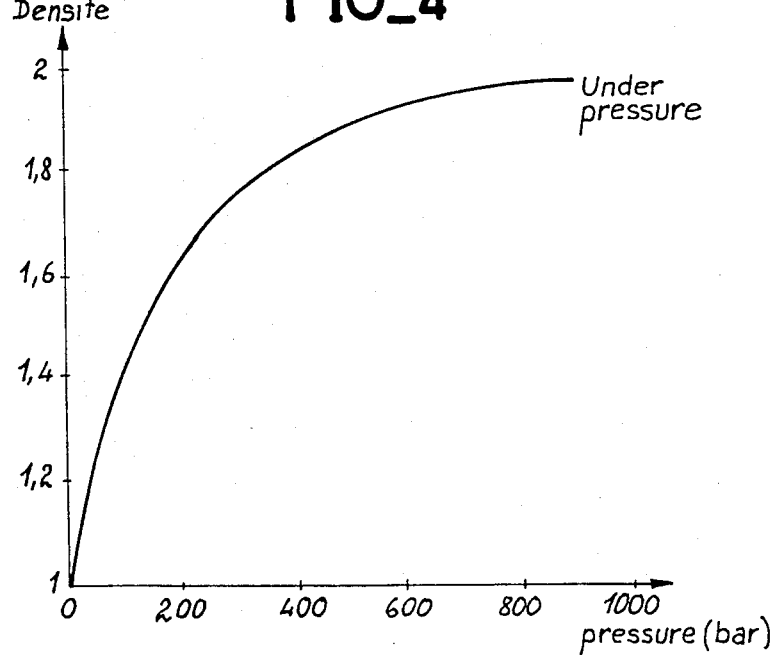
FIG_4

MOUNTING FOR PRINTED CIRCUITS FORMING A HEAT SINK WITH CONTROLLED EXPANSION

FIELD OF THE INVENTION

The present invention relates to mountings which can be used to hold the printed circuits that form electronic boards, especially circuits of the so-called micro-assembled type. These mountings are capable of discharging the heat released by these boards and restricting deformation caused by increase in temperature. The invention also pertains to methods for manufacturing these mountings.

DESCRIPTION OF THE PRIOR ART

There are known methods for making so-called micro-assembled electronic boards such as those shown, for example, in FIG. 1 by fixing, on a printed circuit card 101, comprising interconnections such as 102, components, for example semi-conductor integrated circuits encapsulated in ceramic packages such as 103 known as chip carriers. These components have no output pins but only terminals that are flush with the surface of the package and are rigidly fixed on it. These terminals do not enables the absorption of thermal strains due to the expansion of both the package and the printed circuit under the effect of pins or mounts of conventional integrated circuits encapsulated in plastic for example.

The expansion coefficient of the ceramic used in these packages (6 to 7 PPM/°C.) is lower than that of conventional materials, such as epoxy glass which is used to make printed circuits (13 to 16 PPM/°C.). Consequently, an expansion differential is obtained during the rise in temperature and, at the end of a certain number of cycles, cracks appear in the welds or solderings that connect the terminals of the packages to the tracks of the printed circuit, and these cracks damage the reliability of the assembly.

In the prior art, to remove this disadvantage, the expansion coefficient of the printed circuit is adjusted to that of the ceramic by fixing it rigidly, for example, by bonding with an adhesive layer 104, onto a mounting 105. This mounting 105 has an expansion coefficient that is very low and very close to that of the ceramic and a high Young's modulus so that it applies stress to the printed circuit card 101 by resisting its excess expansion with respect to that of the packages 103. These mountings are generally called dimensional stabilizers. In cases where the micro-assembled board dissipates a great quantity of heat, the mounting is also generally designed so that it can discharge a maximum number of calories.

A first approach to manufacturing a mounting of this kind consists in making a metallic structure which is also called a colaminated structure. The most commonly known of these structures comprises a layer of invar sandwiched between two layers of copper. As is known, invar is an iron alloy with 36% of nickel. Invar has a very low expansion coefficient which is close to zero. Since copper has an expansion coefficient which is substantially equal to 17 PPM/°C., by adjusting the thicknesses of copper and invar, it is possible to obtain the desired expansion coefficient. The copper thicknesses to be used are relatively great, thus making it possible to obtain, in addition, high thermal conductivity. The results obtained with approach are satisfactory but in order to obtain high thermal conductivity, for example, higher than 140 W/°C.m, a fairly heavy structure must be used.

One method to reduce this weight, shown in FIG. 1, consists in the use of two flat, colaminated copper/invar sheets, 106 and 107, which sandwich another wave-shaped colaminated sheet 108. This allows a cooling fluid 109 to flow in the empty space between the central layer and the external layer and further makes it possible to take advantage of the cooling thus obtained to reduce the thickness of these three layers.

Ferro-nickel alloys other than invar, or also molybdenum, may be used.

Another method to makes these mountings consists in using composite materials with a low expansion coefficient, consisting for example, of polyimide fiber such as "Kevlar", or quartz fibers embedded in an epoxy resin matrix or a polyimide matrix. These materials have a high Young's modulus but are very poor conductors of heat. Furthermore, their application is not yet very well mastered. However, there is one known composite material, carbon/carbon, which not only has a high Young's modulus and has the property of being light, but is also a good conductor of heat. However, this material is very expensive and difficult to obtain. This is why its use is reserved for very special applications such as for satellites.

SUMMARY OF THE INVENTION

To remove these disadvantages, the invention provides a support of this type by using a central layer consisting of highly compressed graphite sheets to give high lateral thermal conductivity with low density. Since this layer is relatively brittle, it is sandwiched between two thinner layers with a high modulus and a very low expansion coefficient, consisting of stratified sheets of carbon fibers embedded in a binder such as epoxy resin. To complement the mechanical strength of the unit, it is held in a metallic frame which has little expansion.

BRIEF DESCRIPTION OF THE FIGURES

Other features and advantages of the invention will emerge more clearly from the following description which is given as a non-exhaustive example and made with reference to the appended Figure, of which:

FIG. 1 shows a perspective view of a mounting according to the prior art,

FIG. 2 shows a section of a mounting according to the invention,

FIGS. 3 and 4 are characteristic curves of the material used for the invention.

DESCRIPTION OF THE PREFERRED EMBODIMENTS

FIG. 2 shows a mounting according to the invention seen in a perspective view and in a section view.

This mounting comprises essentially a core 208 formed of graphite sheets which themselves consist of particles that are highly oriented in the plane of the sheet. In particular, sheets of this type can be obtained from the firm LE CARBONE-LORRAINE which markets them under the brand name of "PAPYEX". These sheets form a highly anisotropic material. In the invention, it is essentially the property of lateral thermal anisotropy that is used. For the lateral thermal conductivity, i.e. the conductivity in the plane of the sheet, increases very quickly with density, especially when this density varies between 1 and 1.4 so that the conductivity is high even for low densities. The relationship governing the variation of this conductivity, expressed in W/°C.m, is shown in FIG. 3. To obtain this variation in density which results in a variation in conductivity, it is enough to press the graphite sheets, for example between the plates of a press under pressure of a few hundreds of bars. The variation in density as a function of pressure, expressed in bars, is shown in FIG. 4.

In reading the graphs of FIGS. 3 and 4 together, it is seen that, from a density greater than 1.2, corresponding to a quite moderate pressure of 40 bars, a thermal conductivity of more than 200 W/°C.m is obtained. This conductivity is quite satisfactory in most examples encountered in practice, and the corresponding density of the material is remarkably low when compared with that of invar. The expansion coefficient of this material is almost zero but since it is unfortunately quite brittle, it is sandwiched between two layers or skins, 206 and 207. Thus the printed circuit card which will be bonded on them can stress this sandwich without breaking it.

For this, these skins are made by using carbon fibers which are placed contiguously and bonded by an epoxy resin forming a matrix. These fibers are arranged in the form of at least two layers, called "folds", which intersect each other to provide anisotropy of resistance to strain. These layers are most usually made to intersect at 90° with respect to each other, and their orientation with respect to the edges of the support may have various values. According to one of the most commonly used values, one fold is placed at 0° and one fold at 90°, i.e. the first fold is parallel to the large side of the mounting and the second fold is perpendicular to it. One alternative that gives improved anisotropy consists in using a +45°/−45° orientation. These folds are available in the market in an epoxy resin pre-impregnated form, ready for use and known as high-temperature epoxy carbon.

The thermal conductivity of the skins thus made is relatively average but, with skins of a thickness ranging between 100 and 300 μm, this method makes it possible to obtain a Young's modulus of over 100 GPa, which is generally adequate for normal uses where the thickness of the core ranges between 0.5 and 2 mm.

This small thickness thus gives the unit adequate thermal conductivity.

If necessary, the thermal conductivity of the folds forming the skin could be increased by using copper-coated or nickel-coated carbon fibers.

To obtain a mounting with dimensioning that is precise and with edges that will withstand any shocks, a frame 210 is used. This frame borders the entire periphery of the core and the skins are fixed to it. Of course, this frame must have suitable thermal conductivity, and to this end, it is possible to use, for example, a copper/invar alloy to form the frame.

A method to make a mounting according to the invention comprises, for example, the following steps:

first of all the frame 210 is made by quite common mechanical assembling methods;

then the core is made by stacking the interior of this frame with a sufficient quantity of graphite sheets, for example, of the PAPYEX type, and the entire unit is subjected to pressure of several hundreds of bars, for example, 600 bars, so that the graphite is pressed to the desired degree. The initial thickness of the stack of sheets is planned so that when the desired pressure is applied, the plates of the press come to a stop at the frame, and so that the core that is thus compressed becomes flush with the frame;

then the folds are cut to the external dimensions of the frame and are placed on this frame, being made to intersect according to the desired orientation. Then the entire unit is subjected to a pressure of a few bars, for example 7 bars, at a relatively moderate temperature, for example 175° C.;

in a final stage, the epoxy resin impregnating the folds is totally polymerized by putting the entire unit in an oven for a few hours, for example four hours, at a temperature which is slightly higher than that of the preceding stage, for example 190°C.

By using the temperature and pressure values given for the above example, a mounting is obtained with an expansion coefficient ranging between 0 and 3 PPM/°C., lateral thermal conductivity ranging between 200 and 300 W/°C.m, density ranging between 1.5 and 3 and a Young's modulus ranging between 120 and $200 \times 10^9$ Pa.

What is claimed is:

1. A mounting for printed circuits, said mounting forming a heat sink having low heat expansion characteristics, comprising:
   (i) a central graphite layer made of compressed graphite sheets having a lateral thermal conductivity greater than 200 W/m.°C. and a density lower than 1.4; said sheets consisting essentially of particles highly oriented in the plane of each sheet; and
   (ii) two outer layers, each made of carbon fibers bound together by a resin matrix, said outer layers displaying a high Young'modulus and sandwiching the central graphite layer.

2. A mounting according to claim 1, further comprising a metallic frame that surrounds the central layer to make the mounting rigid, said frame being made of an alloy with a low expansion coefficient.

3. A mounting according to claim 2, wherein the outer layers are made up of several folds of parallel fibers, said folds intersecting each other.

4. A mounting according to claim 3, wherein said folds are so placed that said fibers are oriented successively at 0° and at 90° with respect to the edges of the mounting.

5. A mounting according to claim 3, wherein said folds are so placed that said fibers are oriented successively at −45° and at +45° with respect to the edges of said mounting.

6. A mounting according to claim 1, wherein the fibers forming the outer layers are coated with a heat-conducting material such as copper or nickel.

* * * * *